(12) United States Patent
Kimura et al.

(10) Patent No.: US 11,429,089 B2
(45) Date of Patent: Aug. 30, 2022

(54) APPARATUS, METHOD AND PROGRAM

(71) Applicant: YOKOGAWA ELECTRIC CORPORATION, Tokyo (JP)

(72) Inventors: Yuuri Kimura, Tokyo (JP); Tatenobu Seki, Tokyo (JP); Nobuaki Ema, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 149 days.

(21) Appl. No.: 16/860,062

(22) Filed: Apr. 27, 2020

(65) Prior Publication Data

US 2020/0257277 A1 Aug. 13, 2020

Related U.S. Application Data

(63) Continuation of application No. PCT/JP2018/048594, filed on Dec. 28, 2018.

(30) Foreign Application Priority Data

Dec. 28, 2017 (JP) .............................. JP2017-254866

(51) Int. Cl.
*G06G 7/48* (2006.01)
*G05B 19/418* (2006.01)
*G06F 30/20* (2020.01)

(52) U.S. Cl.
CPC ... *G05B 19/41885* (2013.01); *G05B 19/4183* (2013.01); *G05B 19/41865* (2013.01); *G06F 30/20* (2020.01); *G05B 2219/32359* (2013.01)

(58) Field of Classification Search
CPC .......... G05B 19/4183; G05B 19/41865; G05B 19/41885; G06F 30/20
USPC ............................................................ 703/6
See application file for complete search history.

(56) References Cited

U.S. PATENT DOCUMENTS

| | | | |
|---|---|---|---|
| 9,317,331 B1* | 4/2016 | Koh ...................... G06F 9/5066 |
| 10,520,934 B2 | 12/2019 | Seki | |
| 2009/0292514 A1* | 11/2009 | McKim ................... G06F 30/20 |
| | | | 703/6 |
| 2013/0054621 A1 | 2/2013 | Kretz | |
| 2014/0039859 A1* | 2/2014 | Maucec .................. E21B 43/00 |
| | | | 703/10 |
| 2018/0253680 A1* | 9/2018 | Jahani .................. G06Q 10/087 |

FOREIGN PATENT DOCUMENTS

| | | |
|---|---|---|
| EP | 1560087 A2 | 8/2005 |
| EP | 3203338 A1 | 8/2017 |
| JP | 2017138919 A | 8/2017 |

OTHER PUBLICATIONS

ISR and Written Opinion of the International Search Authority for International Patent Application No. PCT/JP2018/048594, issued/mailed by the Japan Patent Office dated Apr. 11, 2019.

* cited by examiner

*Primary Examiner* — Andre Pierre Louis

(57) ABSTRACT

To easily generate a dynamic model for performing a dynamic simulation of a plant, an apparatus, a method and a program are provided, the apparatus including a static model acquiring unit configured to acquire a static model indicating a steady state of the plant, a piping and instrumentation diagram data acquiring unit configured to acquire piping and instrumentation diagram data of the plant, and a matching unit configured to match a device included in the static model with a device included in the piping and instrumentation diagram data to identify a device-to-device correspondence relation.

11 Claims, 10 Drawing Sheets

| TAG NAME | CV1 |
|---|---|
| TYPE | VALVE OBJECT |
| VALVE CHARACTERISTIC | LINEAR |
| SIZE | 100 |
| ... | ... |
| ⋮ | ⋮ |

*FIG.4*

| TAG NAME | CV1 |
|---|---|
| TYPE | BALL VALVE |
| ATTRIBUTE | PIPE CONNECTION DEVICE |
| ... | ... |
| ⋮ | ⋮ |

FIG.5

APPARATUS, METHOD AND PROGRAM

CROSS REFERENCE TO RELATED APPLICATIONS

This is a continuation application of International Application No. PCT/JP2018/048594, filed on Dec. 28, 2018, which claims priority to Japanese Patent Application No. 2017-254866, filed on Dec. 28, 2017, the contents of each of which are incorporated herein by reference.

BACKGROUND

1. Technical Field

The present invention relates to an apparatus, a method and a program.

2. Background

Conventionally, for a plant and the like, a design, a performance evaluation, an operator training and the like have been performed using a plurality of pieces of software before completion of an actual plant. For example, software, such as a static simulator to simulate a steady state and the like of the plant, plant engineering software to create a piping and instrumentation diagram and the like of the plant, and a dynamic simulator to simulate a dynamic behavior and the like of the plant, has been used (see Japanese Patent Application Publication No. 2017-138919, for example).

SUMMARY OF INVENTION

However, because pieces of software respectively perform, in accordance with respective purposes, inputs of required data, processing on input data, outputs of processing results and the like, there is no compatibility between different pieces of software. For example, when a dynamic simulator performs a simulation based on a processing result of a static simulator, a user has to manually perform model conversion and the like to generate a model that can be operated by the dynamic simulator. Therefore, the designing and the like of the plant have required a lot of labor and time.

In a first aspect of the present invention, an apparatus is provided. The apparatus may include a static model acquiring unit configured to acquire a static model indicating a steady state of a plant. The apparatus may include a piping and instrumentation diagram data acquiring unit configured to acquire piping and instrumentation diagram data of the plant. The apparatus may include a matching unit configured to match device included in the static model with a device included in the piping and instrumentation diagram data to identify a device-to-device correspondence relation. The apparatus may further include a dynamic model generating unit configured to generate a dynamic model that is a model calculating a dynamic state of the plant based on a matching result by the matching unit. The dynamic model generating unit may generate the dynamic model by using a connection relation between a plurality of devices in the piping and instrumentation diagram data and parameters of devices that are in the static model and respectively correspond to the plurality of devices. The apparatus may further include a dynamic simulator configured to perform a dynamic simulation by using the dynamic model. The matching unit may include a model converting unit configured to convert the static model and the piping and instrumentation diagram data into a first model based on the static model and a second model based on the piping and instrumentation diagram data, the first and second models having a common representation format. The matching unit may include a matching processing unit configured to match a device included in the first model and a device included in the second model to each other. The dynamic model generating unit may include an integrated model generating unit configured to generate an integrated model by integrating the first model and the second model. The dynamic model generating unit may include a converting unit configured to convert the integrated model into the dynamic model. The matching unit may identify a device-to-device correspondence relation based on a result of comparing device information added to devices included in the static model with device information added to devices included in the piping and instrumentation diagram data. The matching unit may identify a device-to-device correspondence relation based on a result of comparing a connection relation between the devices in the static model with a connection relation between devices in the static model with a connection relation between devices in the piping and instrumentation diagram data. In response to receiving a designation that a first device in the static model and a second device in the piping and instrumentation diagram data are corresponding devices, the matching unit may identify the device-to-device correspondence relation based on a result of comparing a connection relation between the first device and each device in the static model and a connection relation between the second device and each device in the piping and instrumentation diagram data. If there are devices that cannot be matched with another left, the matching unit may further receive a designation of a device-to-device correspondence relation between a device in the static model and a device in the piping and instrumentation diagram data. The matching unit may output devices that are set as matching candidates, including a device included in the static model and a device included in the piping and instrumentation diagram data. The matching unit may match the devices that are set as the matching candidates to each other in response to an approval of the matching candidates. The matching unit may generate a first model that is a semantic model indicating each device and a connection relation between devices in the static model by using ontology of the static model. The matching unit may generate a second model that is a semantic model indicating each device and a connection relation between devices in the piping and instrumentation diagram data by using ontology of the piping and instrumentation diagram data. The matching unit may identify a device-to-device correspondence relation by using the first model and the second model. The apparatus may further include a progress information output unit configured to output progress information indicating a progress of matching each device in the static model with each device in the piping and instrumentation diagram data. In a second aspect of the present invention, a method is provided. The method may include acquiring a static model indicating a steady state of a plant. The method may include acquiring piping and instrumentation diagram data of the plant. The method may include matching a device included in the static model and a device included in the piping and instrumentation diagram data to each other to identify a device-to-device correspondence relation. In a third aspect of the present invention, a program is provided. The program may make a computer serve as the apparatus of the first aspect.

The summary clause does not necessarily describe all necessary features of the embodiments of the present invention. The present invention may also be a sub-combination of the features described above.

BRIEF DESCRIPTION OF DRAWINGS

FIG. 4 shows one example of a first model converted by the model converting unit 152 according to the present embodiment.

FIG. 5 shows one example of a second model converted by the model converting unit 152 according to the present embodiment.

DETAILED DESCRIPTION OF EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
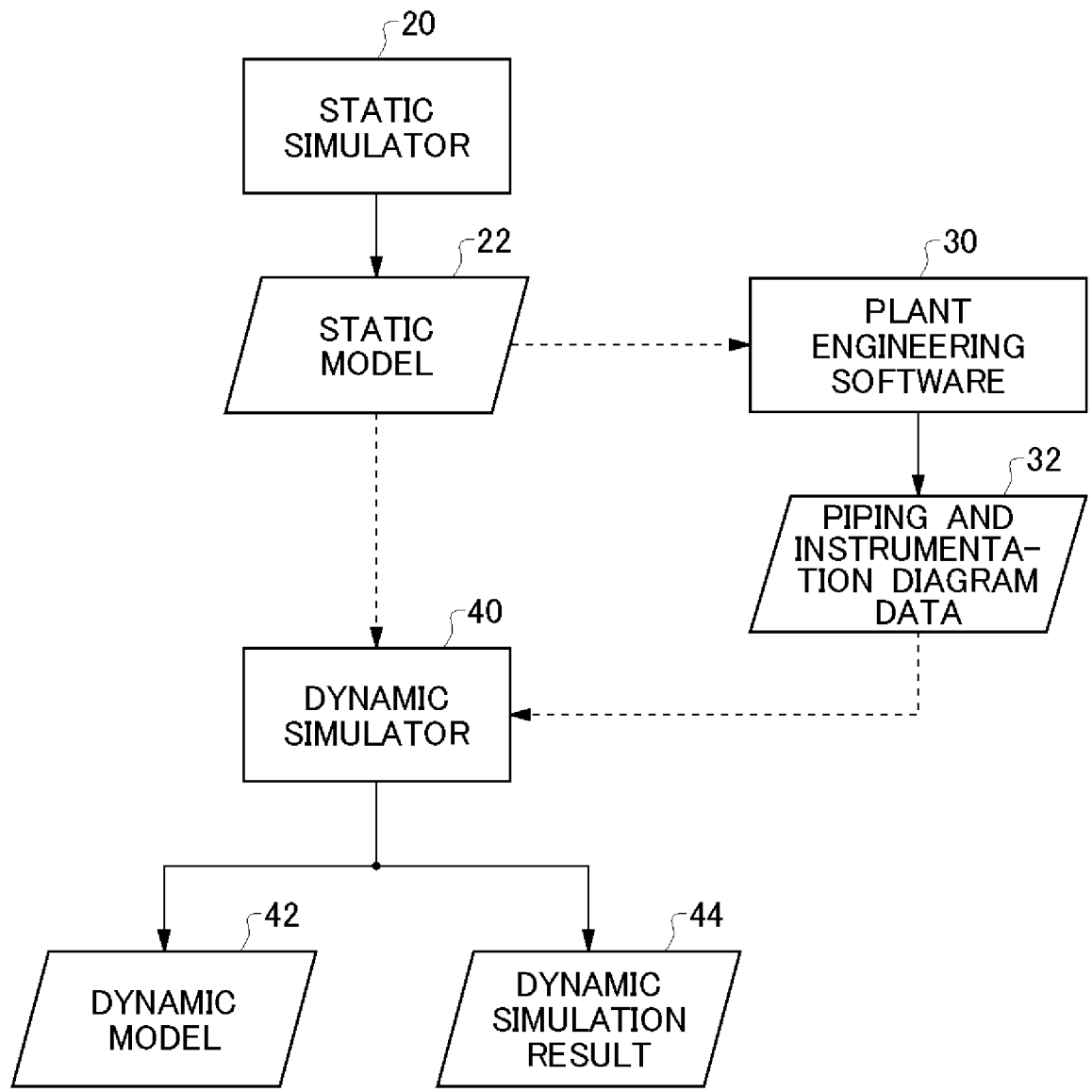
FIG. 1 shows a configuration example of a generating apparatus 10 configured to generate a simulation model of a plant.

FIG. 1 shows a configuration example of a generating apparatus 10 configured to generate a simulation model of a plant. The generating apparatus 10 generates a dynamic model of the plant before completion of the plant to simulate a dynamic behavior and the like. Here, the plant is, for example, at least a part of a factory facility, a mechanical facility, a production facility, a power-generating facility, a storage facility and the like. A simulation target may serve as at least a part of a production plant, a manufacturing plant, a chemical plant, a sludge treatment plant, a wastewater treatment plant, an air conditioning system, a thermodynamic system and the like. The generating apparatus 10 includes a static simulator 20, plant engineering software 30 and a dynamic simulator 40.

The static simulator 20 simulates a steady state of the plant. The static simulator 20 calculates a parameter or the like that a device and the like constituting the plant are to meet in a steady state under an assumed processing condition and the like, and outputs the parameter or the like as a static model 22. For example, the static simulator 20 generates and outputs the static model 22 that models ideal inputs and outputs of the plant that is in a steady operation state. Parameters included in the static model 22 include physical property information and the like of a raw material, a material, and a product. Note that the physical property information includes information and the like of a storage amount, a flow rate, a temperature, a pressure and environment such as an ambient temperature.

The static simulator 20 may generate the static model 22 based on outputs, that the plant is to achieve, such as a product, a supplied substance, management quality and the like. Also, the static simulator 20 may generate the static model 22 based on a process flow diagram (PFD) and the like. For example, the static simulator 20 represents, by a plurality of parameters, inputs and outputs of each device constituting the plant, external factors such as an environment, and the like. For example, the static simulator 20 represents the plurality of parameters by simultaneous equations.

As one example, the static simulator 20 sets an input-output difference, such as a material balance of the materials, the product and the like, and a heat balance or the like, to be zero to calculate a value of each parameter in the steady state. The static simulator 20 may calculate a value of each parameter, the value temporally substantially constant. That is, the static simulator 20 may omit a time-depending parameter or the like, or may regard the parameter or the like as a substantially constant value. Also, the static simulator 20 may also calculate each parameter value substantially constant in a predetermined period. Also, the static simulator 20 may also calculate each parameter value at a predetermined time point.

The plant engineering software 30 creates a piping and instrumentation diagram (P & ID) and outputs the same, as piping and instrumentation diagram data 32. Here, the piping and instrumentation diagram data 32 is a drawing that respectively represents, with figures such as symbols and items, piping, instrumentation lines, other components and the like of the plant, for example, and specifically shows, corresponding to a to-be-realized plant, the symbols and the like by connecting the same according to their functional relations.

The piping and instrumentation diagram data 32 illustrates names of devices and piping, shapes of valves, a control system, connections between instrumentation devices and the like, and represents ultimate forms of to-be-constructed apparatuses and the like. That is, the piping and instrumentation diagram data 32 tends to have more information about a number of the devices and a connection between the devices than the information in the static model 22. Such piping and instrumentation diagram data 32 is used for a process control of the plant, a specific design of the piping system and the like. The plant engineering software 30 creates, according to a user operation using the static model 22 as a reference, the piping and instrumentation diagram data 32 corresponding to the static model 22.

The dynamic simulator 40 generates a dynamic model 42, and performs a dynamic simulation by using the generated dynamic model 42. The dynamic simulator 40 generates, by an operation of a user using the piping and instrumentation diagram data 32 as a reference, the dynamic model 42 that is a model calculating a dynamic state of the plant based on the piping and instrumentation diagram data 32. For example, the user picks up, from symbol, items and the like indicated by the piping and instrumentation diagram data 32, symbols, items and the like that affect a temporal change of the plant, arranges the picked-up ones so as to correspond to the static model 22, and generates the dynamic model 42 by the dynamic simulator 40.

Then, the dynamic simulator 40 performs computations on the dynamic model 42 represented by differential equations using a plurality of parameters, for example, based on a physical connection relation between the respective devices and an operation condition of each device. The differential equations that represent transient states show, as one example, a non-zero input-output difference in the material balance of the materials, the product and the like, the heat balance or the like, at one time point. Also, the dynamic simulator 40 calculates, by using the created dynamic model 42, the temporal change of each parameter or the like within a period from when the devices and the like constituting the plant are in a steady state until when they are in the next steady state, for example. That is, the dynamic simulator 40 calculates the temporal change of each parameter or the like by solving the differential equations representing the dynamic model 42.

The dynamic simulator 40 may determine an initial value of each parameter at a predetermined time point, the operation condition of each device and the like to calculate the temporal change of each parameter. For example, the dynamic simulator 40 may set the initial value of each parameter of the plant at an operation starting time point, and the operation condition of each device during a process from the start of the operation to the steady state to simulate the temporal change. Here, the dynamic simulator 40 may adjust the initial value and the like of each parameter based on the simulation result so that the operation of the plant in the steady state corresponds to the static model 22. That is, the dynamic simulator 40 may adjust the operation condition, the parameters and the like in the dynamic model 42 to adjust the process leading to the steady state of the plant.

Also, similarly, the dynamic simulator 40 may perform simulation from the steady state to stop of the operation of the plant. In addition, the dynamic simulator 40 may also simulate a process in which the plant transits from one steady state to another steady state. In addition, the dynamic simulator 40 may also simulate an abnormality occurrence and the like of the plant. The dynamic simulator 40 outputs such a simulation result as a dynamic simulation result 44.

As described above, the generating apparatus 10 can generate the dynamic model 42 and the dynamic simulation result 44 that can simulate the operation of the to-be-manufactured plant. Because a specification required for each device and sizing and the like of the plant can be determined based on such dynamic model 42 and dynamic simulation result 44, the generating apparatus 10 is used for the design and the like of the plant. Also, by the dynamic simulator 40, a dynamic behavior of the plant can be checked. Also, before the completion of the actual plant, an operator training can also be performed according to an operation training system and the like.

The static simulator 20, the plant engineering software 30 and the dynamic simulator 40 provided in the above-described generating apparatus operate respectively separately and independently. In addition, development, upgrading and the like thereof may also be separately performed. That is, even if the plants to be simulated are the same, or the used device data and the like have common parts, there may be no compatibility between the respective pieces of software. Therefore, during a process in which the generating apparatus 10 generates the dynamic model 42, the user has to manually perform checking, setting, addition, modification, conversion and the like on the parameters, units, items and the like. For example, in FIG. 1, the arrows shown by dotted lines indicate parts for which a manual operation of a user is required.

If the scale of the plant to be simulated is large, a lot of time and labor is necessary even only for the generation of such a dynamic model 42. For example, several man-months were also required in some cases even only for arrangements of units and the like and execution of inputs of parameters.

Also, because the manual generation of the dynamic model 42 includes operating the dynamic simulator 40 and editing the model by a user, a user who is acquainted with the operation of the dynamic simulator 40 is required. That is, the working efficiency and the man-hour vary depending on the proficiency level of the user to the dynamic simulator 40, and it may be difficult to smoothly perform the plant design.

Here, the apparatus according to the present embodiment automatically generates the dynamic model 42 based on the static model 22 and the piping and instrumentation diagram data 32 to improve efficiency of the plant design. Such an apparatus is described next. Note that in the present embodiment, a device, a unit, an item and the like are collectively called a "device".

Figure 2:
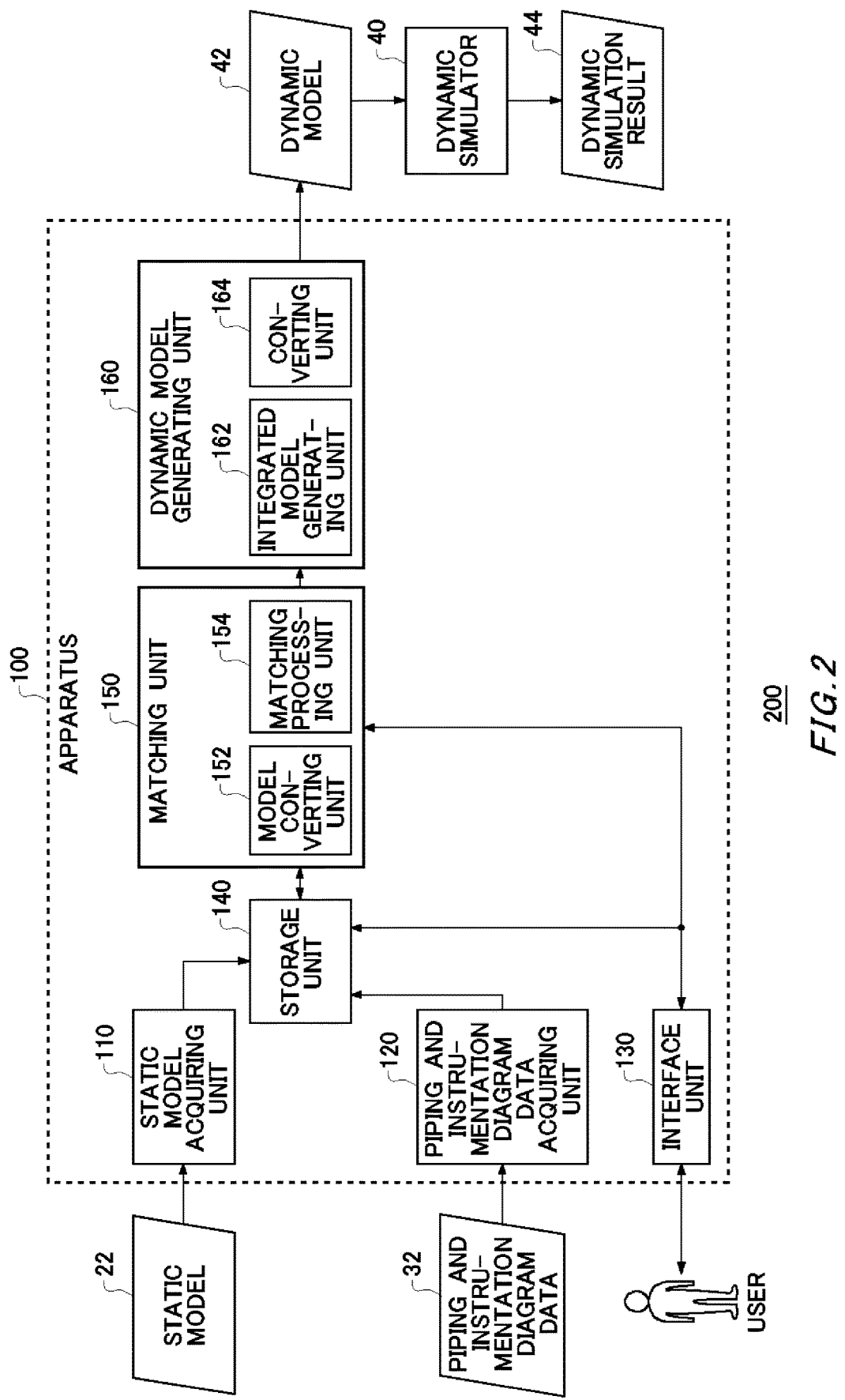
FIG. 2 shows a configuration example of the apparatus 100 according to the present embodiment.

FIG. 2 shows a configuration example of the apparatus 100 according to the present embodiment. The apparatus 100 can generate the dynamic model 42 by matching devices to each other respectively included in the static model 22 and the piping and instrumentation diagram data 32 that have no compatibility with each other based on their relations and the like. The apparatus 100 includes a static model acquiring unit 110, a piping and instrumentation diagram data acquiring unit 120, an interface unit 130, a storage unit 140, a matching unit 150 and a dynamic model generating unit 160.

The static model acquiring unit 110 acquires the static model 22 indicating the steady state of the plant. The static model acquiring unit 110 may receive the static model 22 output from the static simulator 20. Also, the static model acquiring unit 110 may also read and acquire the static model 22 stored in a database and the like. In this case, the static model acquiring unit 110 may acquire the static model 22 via a network and the like. Also, the static model acquiring unit 110 may also acquire the static model 22 by an input from the user.

The piping and instrumentation diagram data acquiring unit 120 acquires the piping and instrumentation diagram data 32 of the plant. The piping and instrumentation diagram data acquiring unit 120 may receive the piping and instrumentation diagram data 32 that is output from the plant engineering software 30. Also, the piping and instrumentation diagram data acquiring unit 120 may also read and acquire the piping and instrumentation diagram data 32 stored in a database and the like. In this case, the piping and instrumentation diagram data acquiring unit 120 may acquire the piping and instrumentation diagram data 32 via a network and the like. Also, the piping and instrumentation diagram data acquiring unit 120 may also acquire the piping and instrumentation diagram data 32 by an input of the user.

The interface unit 130 receives an input, a selection, and a designation and the like from the user. Also, the interface unit 130 may display models, data, drawings and the like to the user, the models, the data, the drawings and the like being in the process in which the apparatus 100 generates the dynamic model 42. The interface unit 130 may include a display screen, an input device and the like that give and receive information. Also, the interface unit 130 may give and receive the information through wired or wireless communications with devices such as a terminal and a mobile terminal used by the user. Note that the user may include a manufacturer, a designer, an operator, an engineer, a developer, a researcher, a worker, an owner, an administrator and the like of the plant.

The storage unit 140 stores the static model 22, the piping and instrumentation diagram data 32, and input data and the like from the user. Also, the storage unit 140 may also store the information of the dynamic model 42 generated by the apparatus 100. Also, the storage unit 140 may be able to store the data on which the apparatus 100 performs processing. The storage unit 140 may also respectively store data, models, data, models, intermediate data, a calculation result, parameters and the like calculated (or utilized) in a process in which the apparatus 100 generates the dynamic model 42. Also, the storage unit 140 may supply, in accordance with a request of each unit in the apparatus 100, the stored data to the unit that has made the request.

The matching unit 150 matches devices included in the static model 22 with the devices included in the piping and instrumentation diagram data 32 to identify a device-to-device correspondence relation. The matching unit 150 may perform the matching based on device information and the like added to the devices. Also, the matching unit 150 may perform the matching based on a connection relation in the static model 22 and a connection relation in the piping and instrumentation diagram data 32. The matching unit 150 may respectively convert the static model 22 and the piping and instrumentation diagram data 32 that have no compatibility with each other into comparable models, and then perform the matching. The matching unit 150 includes a model converting unit 152 and a matching processing unit 154.

The model converting unit 152 converts the static model 22 and the piping and instrumentation diagram data 32 into a first model based on the static model 22 and a second model based on the piping and instrumentation diagram data 32, the first model and the second model having a common representation format. The model converting unit 152 may perform conversion into a common representation format for each device respectively arranged in the static model 22 and the piping and instrumentation diagram data 32 to generate the first model and the second model. Here, the common representation format shows information of connections between the respective elements or an attribute and the like of each element included in the static model 22 and the piping and instrumentation diagram data 32 in a text format. For example, some or all of the information or the attribute and the like may also be shown as data in an Extensible Markup Language (XML) format.

The matching processing unit 154 matches devices included in the first model with devices included in the second model. The matching processing unit 154 may match the devices based on names and the like of the devices. Also, the matching processing unit 154 may matches the devices to each other according to a designation of the user. Also, the matching processing unit 154 may also match the devices to each other based on topology (geometrical information), an attribute, a connection state with another device, and the like of a device.

The dynamic model generating unit 160 generates the dynamic model 42 that is a model calculating a dynamic state of the plant based on a matching result by the matching unit 150. The dynamic model generating unit 160 generates the dynamic model 42 by using a connection relation between a plurality of devices in the piping and instrumentation diagram data 32 and parameters of devices respectively corresponding to the plurality of devices in the static model 22. The dynamic model generating unit 160 includes the integrated model generating unit 162 and the converting unit 164.

The integrated model generating unit 162 generates the integrated model by using the matching result and integrating the first model and the second model. The integrated model generating unit 162 generates the integrated model based on a connection between the matched devices, for example. The integrated model generating unit 162 generates the connection information of the devices in the integrated model based on the matching result and the second model, for example. Also, the integrated model generating unit 162 may generate the device parameter, the physical property information and the like of the integrated model based on the matching result and the first model. The integrated model may have a common representation format with those of the first model and the second model.

The converting unit 164 converts the integrated model generated by the integrated model generating unit 162 into the dynamic model 42. For example, the converting unit 164 generates the dynamic model 42 by using equations that use differentiation and integration of a plurality of parameters based on physical connection relations between respective devices and operation conditions of the respective devices in the integrated model.

The apparatus 100 according to the present embodiment described above can generate the dynamic model 42 based on the static model 22 and the piping and instrumentation diagram data 32. Therefore, the dynamic simulator 40 can output the dynamic simulation result 44 by using the dynamic model 42 generated by the apparatus 100, simulating the operation of the plant and adjusting each parameter and the like. The operation of such an apparatus 100 is described next.

Figure 3:
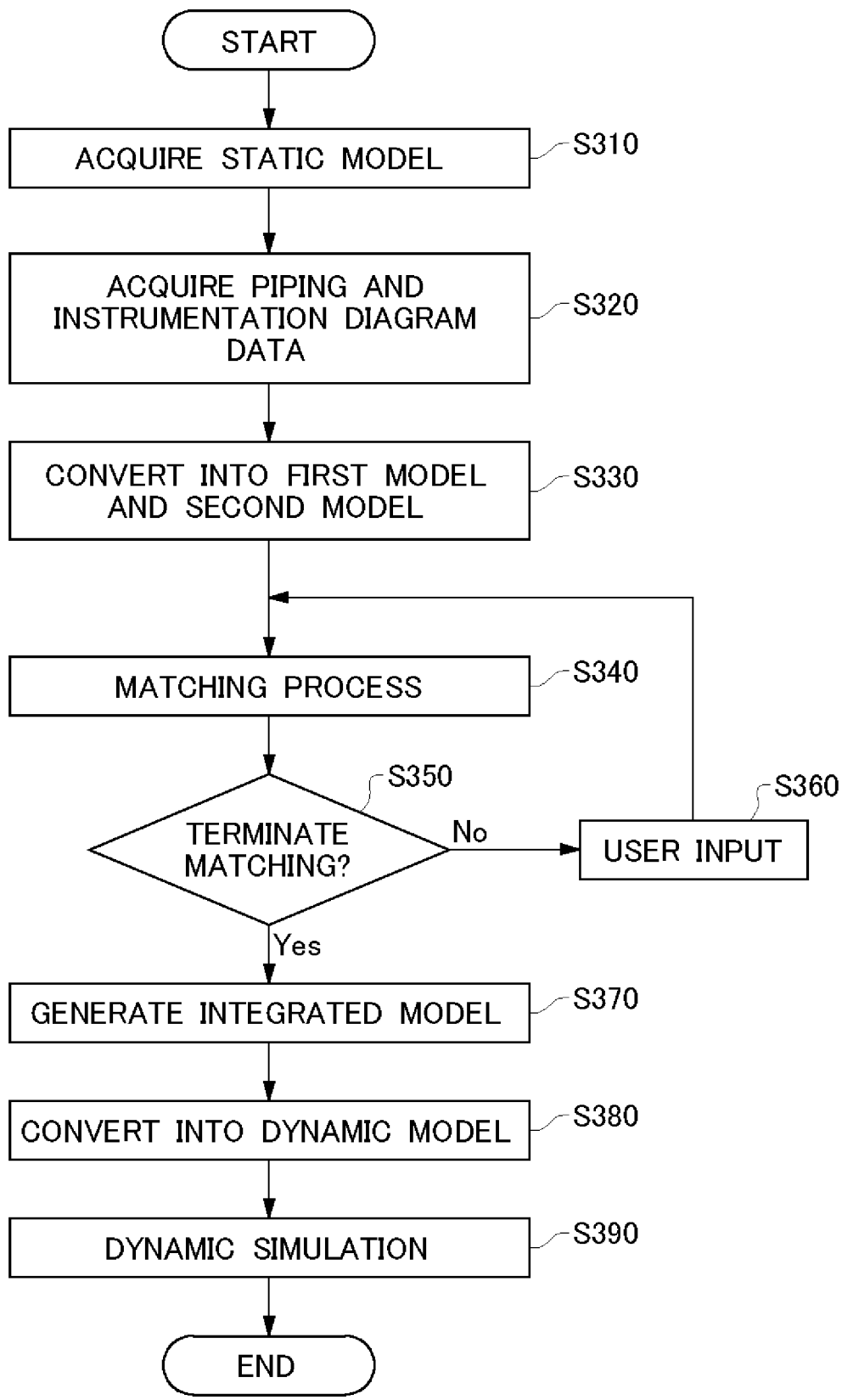
FIG. 3 shows one example of an operation flow of the apparatus 100 according to the present embodiment.

FIG. 3 shows one example of an operation flow of the apparatus 100 according to the present embodiment. The apparatus 100 generates the dynamic model 42 by performing the operation flow shown in FIG. 3.

First, the static model acquiring unit 110 acquires the static model 22 (S310). The static model acquiring unit 110 acquires the static model 22 with a data file in a text format, as one example. The static model acquiring unit 110 may store the acquired static model 22 in the storage unit 140. Also, the static model acquiring unit 110 may also supply the acquired static model 22 to the matching unit 150.

Next, the piping and instrumentation diagram data acquiring unit 120 acquires the piping and instrumentation diagram data 32 (S320). The piping and instrumentation diagram data acquiring unit 120 acquires the piping and instrumentation diagram data 32 with a data file in a text format, as one example. The piping and instrumentation diagram data acquiring unit 120 may store the acquired static model 22 in the storage unit 140. Also, the piping and instrumentation diagram data acquiring unit 120 may also supply the acquired piping and instrumentation diagram data 32 to the matching unit 150.

Next, the model converting unit 152 respectively converts the static model 22 into the first model and the piping and instrumentation diagram data 32 into the second model (S330). The model converting unit 152 converts the static model 22 into the first model by using a first conversion table, for example. The first conversion table may be a table in which a correspondence relation between the static model 22 and the first model is registered in advance. In this case, the first conversion table may be stored in the storage unit 140.

That is, the model converting unit 152 may read the first conversion table from the storage unit 140 to convert the static model 22 into the first model. The first model may be a model in which the device information is added to each device arranged in the static model 22. The device information may include the names, the attributes and the like of the devices.

Also, the model converting unit 152 converts the piping and instrumentation diagram data 32 into the second model by using a second conversion table, for example. The second conversion table may be a table in which a correspondence relation between the piping and instrumentation diagram data 32 and the second model is registered in advance. In this case, the second conversion table may be stored in the storage unit 140. That is, the model converting unit 152 may read the second conversion table from the storage unit 140 to convert the piping and instrumentation diagram data 32 into the second model. The second model may be a model in which the device information is added to each device arranged in the piping and instrumentation diagram data 32. The device information may include the names, the attributes and the like of the devices.

Next, the matching processing unit 154 matches the devices included in the first model with the devices included in the second model (S340). The matching processing unit 154 identifies a device-to-device correspondence relation based on a result of comparing the device information added to the devices included in the static model 22 with the device information added to the devices included in the piping and instrumentation diagram data 32. For example, the matching processing unit 154 extracts sets of devices whose names match each other, as corresponding devices. The names are respectively included in the device information of the respective devices included in the first model and included in the device information of the respective devices included in the second model.

Also, instead of the names of the devices, the matching processing unit 154 may also extract, respectively from the first model and the second model, sets of devices whose types, attributes, set parameters and the like match with each other, as the corresponding devices. The matching processing unit 154 may set the extracted corresponding devices as a matching result.

Next, the matching processing unit 154 determines whether to continue or terminate the matching (S350). For example, the matching processing unit 154 may display the matching result to the user via the interface unit 130 to make the user designate to continue (S350: No) or terminate (S350: Yes) the matching.

Alternatively, the matching processing unit 154 may calculate a percentage of the matched devices among all of the devices included in the static model 22 as a matching rate, and determine whether to continue the matching or not in accordance with the matching rate. For example, the matching processing unit 154 may determine to terminate the matching (S350: Yes) if the matching rate exceeds a predetermined threshold. Also, the matching processing unit 154 may determine to continue the matching (S350: No) if the matching rate is equal to or less than the predetermined threshold.

If the matching processing unit 154 determines to continue the matching (S350: No), the matching processing unit 154 receives an input from the user via the interface unit 130 (S360). An indication of a type and the like of the matching that is the next to be performed may also be input in the interface unit 130. An indication indicating that the matching result is appropriate may also be input in the interface unit 130 by the user.

Also, if a set of devices, among the matching result, that actually do not correspond to each other is extracted, an indication indicating that the set of devices is excluded from the matching result may be input in the interface unit 130 by the user. Also, a designation indicating that a first device in the static model 22 and a second device in the piping and instrumentation diagram data 32 are the corresponding devices may also be input in the interface unit 130 from the user. That is, if there are devices that cannot be matched with the other left, the matching processing unit 154 may further receive a designation of a device-to-device correspondence relation between the devices in the static model 22 and the devices in the piping and instrumentation diagram data 32.

The matching processing unit 154 performs matching processing in response to the indication of the user (S340). Also, the matching processing unit 154 may increase or decrease a number of sets of corresponding devices as the matching result according to the indication of the user. Also, if there is another set of devices corresponding to the designation of the user, the matching processing unit 154 may similarly increase or decrease the number of the sets of the corresponding devices. Also, the matching processing unit 154 may also perform a different type of matching from that of the previous matching. The matching processing unit 154 may repeat the operations in S340 to S360 until the matching is terminated. Also, if the operations in S340 to S360 have been repeated for a predetermined times, the matching processing unit 154 may also terminate the matching.

Next, the integrated model generating unit 162 generates the integrated model by using the matching result (S370). The integrated model generating unit 162 may set, for example, connection information of parts including at least the matched devices among the second model as the connection information of the devices in the integrated model. Also, the integrated model generating unit 162 may set the parameters, the physical property information and the like of the matched devices included in the first model as the parameters, the physical property information and the like of the corresponding devices in the integrated model.

Next, the converting unit 164 converts the integrated model into the dynamic model 42 (S380). Accordingly, the apparatus 100 of the present embodiment can output the dynamic model 42. Therefore, the dynamic simulator 40 can simulate the operation of the plant by using the dynamic model 42 generated by the apparatus 100 (S390). Note that although an example in which the apparatus 100 shown in FIG. 2 is configured as an apparatus separately and independently from the dynamic simulator 40 is shown, the apparatus 100 is not limited to this. The apparatus 100 may also further include the dynamic simulator 40.

As described above, because the apparatus 100 of the present embodiment converts the static model 22 and the piping and instrumentation diagram data 32 that have different formats from each other into the first model and the second model that have substantially the same format, the matching unit 150 can easily perform the matching. Also, the apparatus 100 can automatically perform the matching by searching for the devices having the matched device information.

Also, the apparatus 100 makes the user check the matching result to acquire an indication for a further matching. Accordingly, the apparatus 100 can also match the devices having device information that do not match with each other. Also, the user can acquire the matching result with high perfection by only indicating lacking to-be-matched targets based on the result obtained by the matching. Also, the user can acquire the matching result with high perfection by only indicating a wrong matching result based on the result obtained by the matching.

Also, the integrated model generating unit 162 uses the first model converted from the static model 22 having the device parameter and the physical property information to determine the device parameter, the physical property information and the like of the devices in the integrated model. Then, the integrated model generating unit 162 uses the second model converted from the piping and instrumentation diagram data 32 having the detailed connection information of the devices to determine the connection information of the devices and the like in the integrated model. Accordingly, the apparatus 100 can extract, from an appropriate model, the device parameters, the physical property information, the connection information of the devices and the like that are necessary for the dynamic model 42, and incorporate the extracted ones to the integrated model.

Also, the apparatus 100 can easily convert the integrated model into the dynamic model 42 based on the matching result by setting substantially the same format to a format that is possible to be converted into the dynamic model 42. In this way, because the apparatus 100 according to the present embodiment can easily generate the dynamic model 42 that can be operated by the dynamic simulator 40, working hours and labor of a user can be reduced. Because such working hours and labor of the user are greater as a scale of the plant is larger, it is also possible to reduce the man-hours of the user for manually creating the dynamic model 42 to approximately 60%, for example.

Also, because the apparatus 100 can generate the dynamic model 42 without using the dynamic simulator 40, an appropriate dynamic model 42 can be generated irrelevantly to the proficiency level of the user to the dynamic simulator 40. As described above, according to the apparatus 100 according to the present embodiment, the working efficiency of the generation of the dynamic model 42 can be improved and the plant design can be smoothly performed.

FIG. 4 shows one example of the first model converted by the model converting unit 152 according to the present embodiment converts. Also, FIG. 5 shows one example of the second model converted by the model converting unit 152 according to the present embodiment. FIG. 4 and FIG. 5 respectively show one example of the conversion result relative to the same device. Even if the device is the same, because the static model 22 and the piping and instrumentation diagram data 32 respectively have information corresponding to purposes, the first model and the second model, that have the format in common with each other, converted by the model converting unit 152 still almost have no item in common with each other in some cases.

In the cases of the examples of FIG. 4 and FIG. 5, for example, because the "CV1" being a "tag name" is in common with each other as a name of a device, the matching processing unit 154 sets the devices having the "CV1" being the tag name in the first model and the second model as the corresponding devices. However, for example, in the examples of FIG. 4 and FIG. 5, if the tag names are different from each other it is difficult to automatically extract the devices as the corresponding devices. Note that although FIG. 4 and FIG. 5 show the first model and the second model in a table format for an easy understanding, the format is not limited to this and the first model and the second model may be described in various formats. The first model and the second model are shown in XML data, for example.

Figure 6:
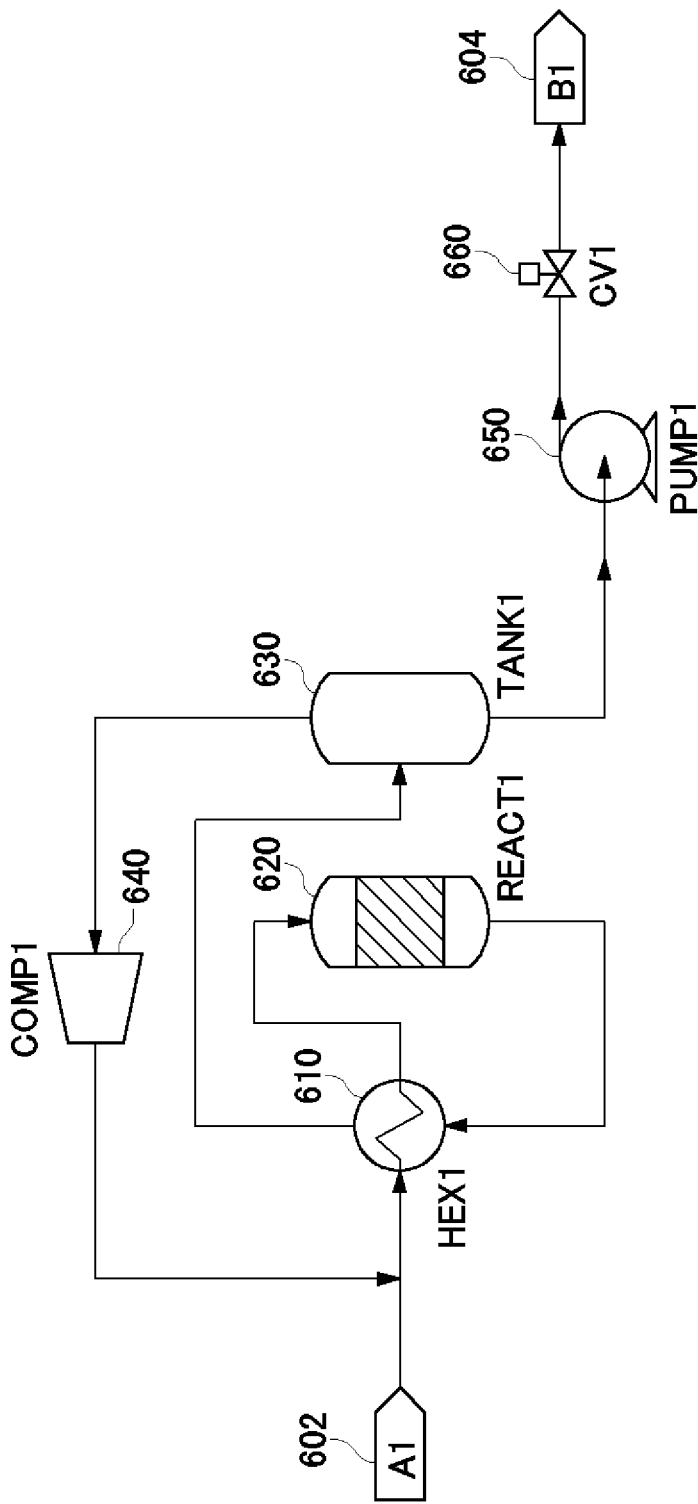
FIG. 6 shows one example of a static model 22 according to the present embodiment.

FIG. 6 shows one example of the static model 22 according to the present embodiment. FIG. 6 is an example of the static model 22 described for a plurality of devices from an input unit 602 to an output unit 604. Note that in FIG. 6 the description for the physical property information of each device is omitted. The static model 22 includes a heat exchanger 610, a reactor 620, a tank 630, a compressor 640, a pump 650 and a valve 660.

Figure 7:
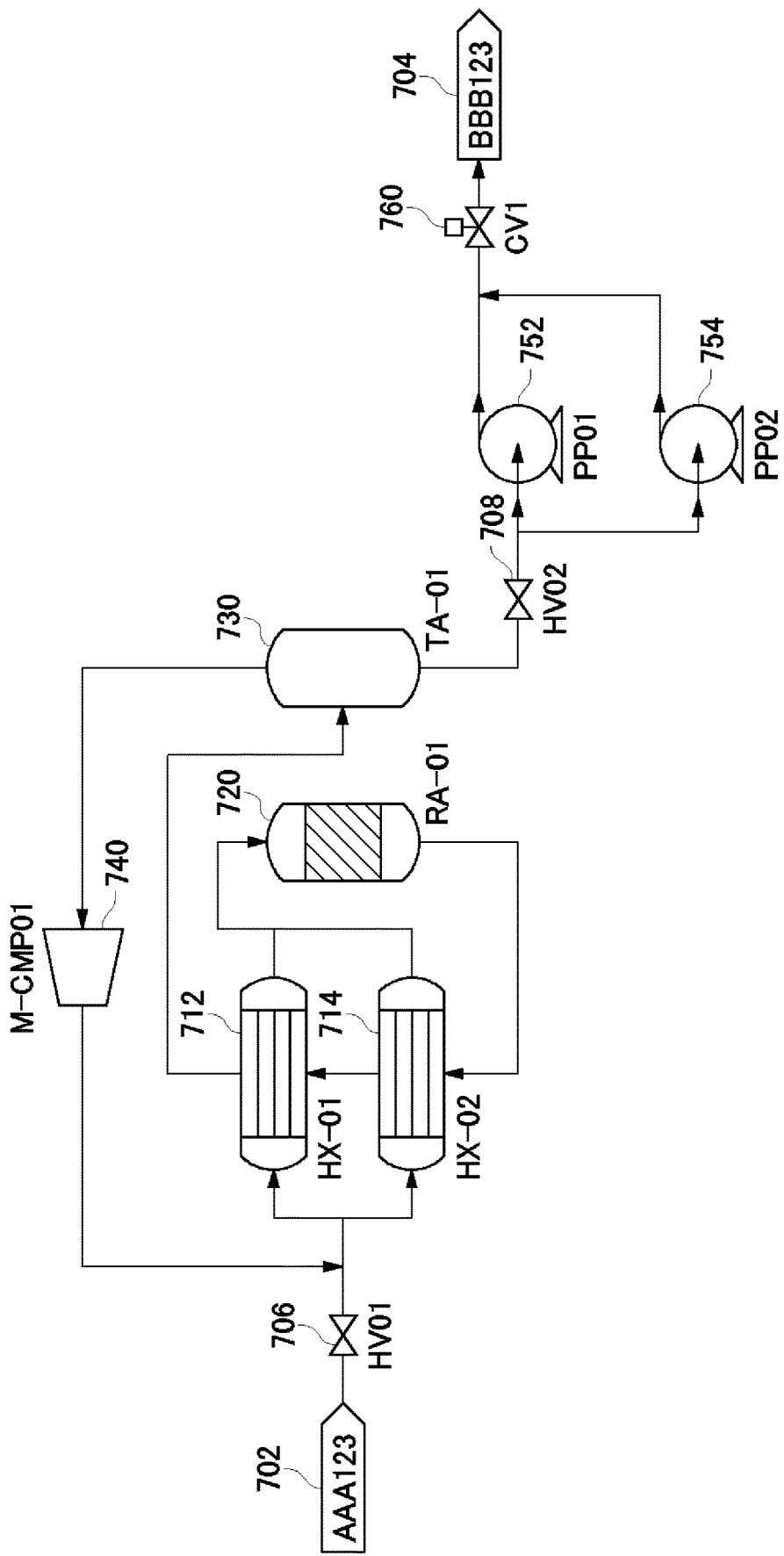
FIG. 7 shows one example of piping and instrumentation diagram data 32 according to the present embodiment.

FIG. 7 shows one example of the piping and instrumentation diagram data 32 according to the present embodiment. FIG. 7 is an example of the piping and instrumentation diagram data 32 described for a plurality of devices from an input unit 702 to an output unit 704. The piping and instrumentation diagram data 32 includes a valve 706, a first heat exchanger 712, a second heat exchanger 714, a reactor 720, a tank 730, a compressor 740, a valve 708, a first pump 752, a second pump 754 and a valve 760.

The piping and instrumentation diagram data 32 shown in FIG. 7 is data indicating portions that are substantially the same as the static model 22 shown in FIG. 6. Because the piping and instrumentation diagram data 32 has more detailed connection information of the devices than that of the static model 22, information of the devices such as the valve 706 and the valve 708 have been added thereto, for example. Note that the piping and instrumentation diagram data 32 does not include the physical property information and the like of each device.

Comparing FIG. 6 with FIG. 7, the reactor 620 and the reactor 720, the tank 630 and the tank 730, the compressor 640 and the compressor 740, and the valve 660 and the valve 760 are respectively the corresponding devices, and it is desirable to extract these devices by the matching. However, these devices may be described by different names and attributes, as described in FIG. 4 and FIG. 5. For example, the name of one of the reactor 620 and the reactor 720 is "REACT1" and the name of the other thereof is "RA-01", and accordingly, it is difficult to automatically match the devices.

Also, in the static model 22, the heat exchanger 610 and the pump 650 are respectively shown as one ideal device. On the other hand, in the piping and instrumentation diagram data 32, two devices, such as the first heat exchanger 712 and the second heat exchanger 714, and the first pump 752 and the second pump 754, are shown, and a configuration and a connection may be different from those in the static model 22. This is a result of connecting a plurality of devices in parallel or in series by taking installation locations, device performance and the like into account to meet the specification of the device that is considered in the static model 22, and the piping and instrumentation diagram data 32 shows that the configuration diagram is closer to the design drawing of the actual plant. Note that even in this case, because the names of the plurality of devices may be respectively different and the connection relations are also different, it is difficult to automatically perform the matching.

It is described that the apparatus 100 of the present embodiment can perform the matching by receiving the indication from the user in such a case. In addition to this, the apparatus 100 may also perform the matching by taking a relation of the device information, the connection relation between the devices and the like into account. For example, the apparatus 100 registers the relation of the device information in advance.

In the examples of FIG. 4 and FIG. 5, for example, the apparatus 100 stores in advance, in the storage unit 140, that the "valve object" and the "ball valve" mean the devices that have different names from each other but correspond to each other. Also, in the examples in FIG. 6 and FIG. 7, the apparatus 100 stores in advance, in the storage unit 140, that the "REACT1" and the "RA-01" mean the devices that have different names from each other but correspond to each other. The matching processing unit 154 can determine whether the devices even having different names from each other are the corresponding devices or not by reading such a relation of the device information as a reference from the storage unit 140, and can match the devices.

Also, the matching processing unit 154 may also identify a device-to-device correspondence relation based on the result of comparing the connection relation between the devices in the static model 22 with the connection relation between the devices in the piping and instrumentation diagram data 32. For example, the matching processing unit 154 may determine that the valve 660 connected to the output unit 604 and the valve 760 connected to the output unit 704 are the corresponding devices. Note that because the valve 660 and the valve 760 have the same name "CV1", the matching processing unit 154 may also determine that the valve 660 and the valve 760 are the corresponding devices based on the name.

Then, the matching processing unit 154 compares the pump 650 that is connected to an input end of the valve 660 with the first pump 752 and the second pump 754 that are connected to an input end of the valve 760 after matching the valve 660 with the valve 760. The connection between the first pump 752 and the second pump 754 is a parallel connection in which the input ends of the two devices are connected and so are the output ends of the two devices. That is, it can be determined that one device in the static model 22 is realized by two devices, that is, the first pump 752 and the second pump 754 in the piping and instrumentation diagram data 32. In such a case, the matching processing unit 154 may determine that the pump 650, and the first pump 752 and the second pump 754 are the corresponding devices.

Also, after matching the pump 650 with the first pump 752 and the second pump 754, the matching processing unit 154 compares the tank 630 connected to an input end of the pump 650 with the valve 708 connected to an input end of the first pump 752 and to an input end of the second pump 754. In the connection to the tank 630, an input end of the tank 630 is connected to one device and two output ends of the tank 630 are respectively connected to one device. An input end of the valve 708 is similarly connected to one device, but there is only one output end on the valve 708. Here, the matching processing unit 154 may determine that the tank 630 and the valve 708 are not the corresponding devices.

The matching processing unit 154 may also further compare a next device connection after performing the determination of the tank 630 and the valve 708. For example, because the piping and instrumentation diagram data 32 has more detailed connection information of the devices than that of the static model 22, the matching processing unit 154 may determine that the valve 708 in the piping and instrumentation diagram data 32 is the device that does not exist in the static model 22. Then, the matching processing unit 154 compares the tank 630 with the tank 730 connected to the input end of the valve 708. Further, because the connection in the tank 630 is in substantially the same form as that of the connection in the tank 730, the matching processing unit 154 may determine that the tank 630 and the tank 730 are the corresponding devices.

In this way, the matching processing unit 154 may identify the correspondence relation between the devices based on the connection information of the devices. Accordingly, the matching processing unit 154 can perform the matching even if the names of the devices are different from each other. Also, the matching processing unit 154 may also identify the corresponding devices by performing another matching method of a different type, such as a matching according to the names of the devices, and then further perform the matching processing from the connection relation between the identified devices.

Also, a designation indicating that a first device in the static model 22 and a second device in the piping and instrumentation diagram data 32 are the corresponding devices may be input in the matching processing unit 154. Such an input may be performed by the operation in S360 in FIG. 3, or may alternatively be made from the interface unit 130 in the operation in S340. The matching processing unit 154 may further identify, in response to receiving the designation, a device-to-device correspondence relation based on a result of respectively comparing a connection relation between the first device and each device in the static model 22 with a connection relation between the second device and each device in the piping and instrumentation diagram data.

Also, as described in FIG. 3 as well, the matching processing unit 154 can make the user check whether the matching is appropriate or not. Therefore, the matching processing unit 154 can accurately perform a more detailed matching. Note that the matching performed by the apparatus 100 based on the relation between the device information, the connection relation between the devices and the like may also be performed based on a known technology, that is called ontology, in computer science, information science and the like.

Here, the ontology may be explained as a formal representation in which knowledge is considered as a set of relations between concepts. For example, by defining a word using a plurality of concepts and relations between the concepts, the word can be distinguished from another word, can be discriminated from a homonym, and can be determined to be a synonym for another word although having different spelling and so on, so that it is possible that the word can be effectively treated as knowledge. As one example, by associating the word "pipe" with concepts "cylinder", "tubular", "gas" and the like, it can be known that the word "pipe" means a tube for passing liquid, gas and the like therethrough, and it can be determined that the word "pipe" is not a "pipe" indicating a tool for smoking a cigarette, a wind instrument, and a function of delivering a value and the like of data in a program. The ontology may also be what described in Riichiro MIZOGUCHI, Science of Intelligence, Ohmsha, Jan. 20, 2005, and may also be what described in What are ontologies, Retrieved Nov. 20, 2017, from https://www.ontotext.com/knowledgehub/fundamentals/what-are-ontologies.

Here, association information according to such ontology may be defined for each device in the static model 22 and each device in the piping and instrumentation diagram data 32, to be utilized for the matching. For example, the model converting unit 152 uses the ontology to convert the static model 22 into the first model and convert the piping and instrumentation diagram data 32 into the second model. For example, the model converting unit 152 uses the ontology of the static model 22 to generate the first model that is a semantic model indicating the respective devices and the connection relation between the devices in the static model 22. Also, the model converting unit 152 uses the ontology of the piping and instrumentation diagram data 32 to generate the second model that is a semantic model indicating the respective devices and the connection relation between the devices in the piping and instrumentation diagram data 32.

Figure 8:
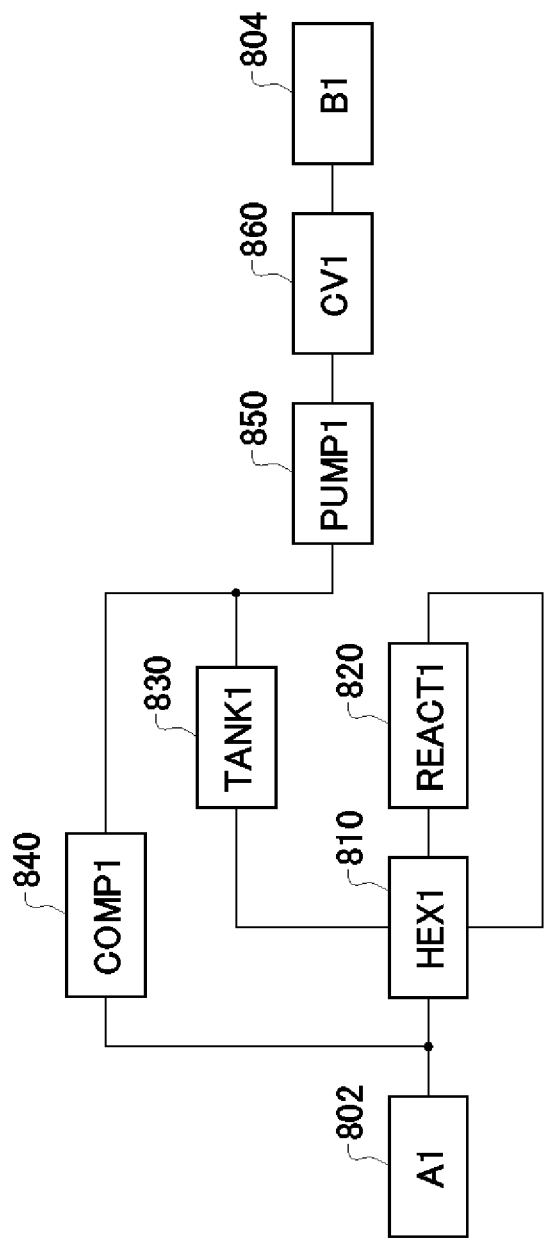
FIG. 8 shows one example of the first model converted by using ontology by the model converting unit 152 according to the present embodiment.

FIG. 8 shows one example of the first model converted by using ontology by the model converting unit 152 according to the present embodiment. FIG. 8 shows a connection relation between the respective devices from the input unit 802 to the output unit 804. In the first model, information of each device in the static model 22 and the connection relation between the respective devices shown in FIG. 6 are incorporated. The first model shows conversion results respectively corresponding to the devices. For example, the heat exchanger 610 is converted into the device 810 having the name "HEX1", the reactor 620 is converted into the device 820 having the name "REACT1", the tank 630 is converted into the device 830 having the name "TANK1", the compressor 640 is converted into the device 840 having the name "COMP1", the pump 650 is converted into the device 850 having the name "PUMP1", and the valve 660 is converted into the device 860 having the name "CV1".

Note that the association information according to the ontology is associated with each device shown in FIG. 8. For example, the device 860 has type information being the "valve object", and accordingly, pieces of association information being the "valve object" and the "ball valve" are associated with the device 860. That is, the association information meaning the valve is associated with the device 860. Also, association information showing that the device associated with the association information being the "pump" may be connected may also be associated with the device 860.

Figure 9:
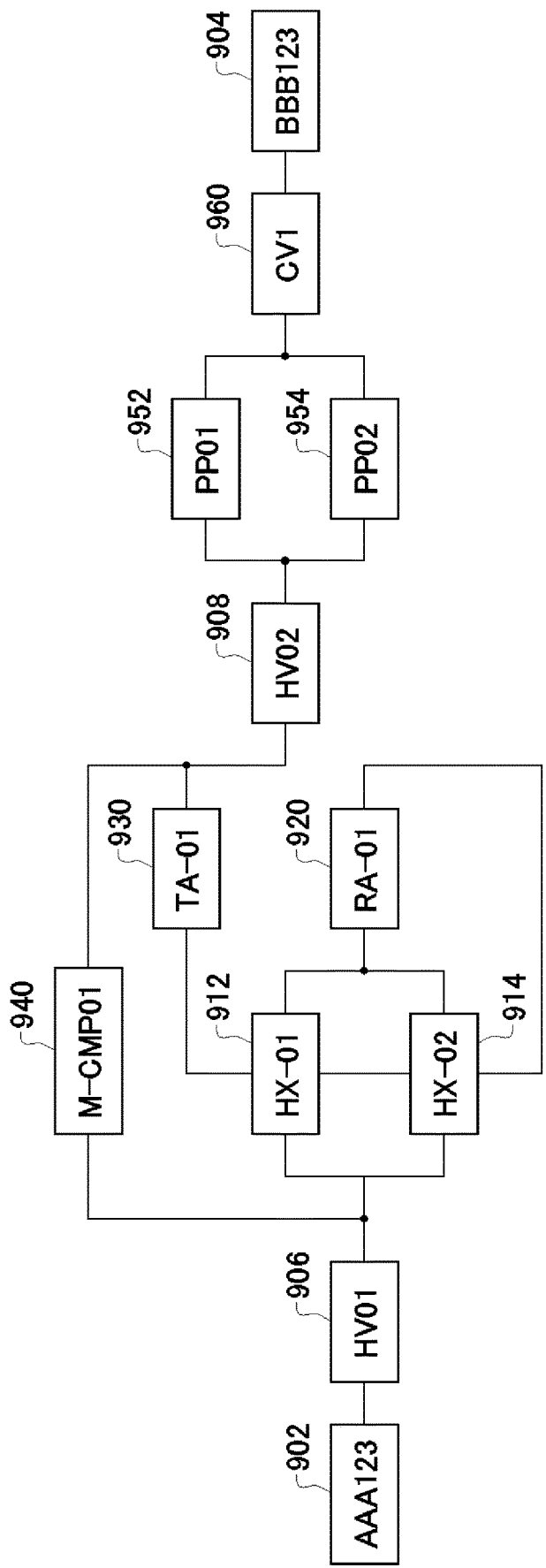
FIG. 9 shows one example of the second model converted by using ontology by the model converting unit 152 according to the present embodiment.

FIG. 9 shows one example of the second model converted by using ontology by the model converting unit 152 according to the present embodiment. FIG. 9 shows a connection relation between the respective devices from the input unit 902 to the output unit 904. Similar to the first model, in the second model, information of the respective devices in the piping and instrumentation diagram data 32 shown in FIG. 7 and the connection relation between the respective devices are incorporated. Also, the association information by the ontology is associated with each device shown in FIG. 9. For example, the device 960 has type information being the "ball valve", and accordingly, pieces of association information being the "valve object" and the "ball valve" are associated with the device 960. That is, association information meaning the valve is associated with the device 960. Also, association information showing that a device associated with the association information being the "pump" may be connected may also be associated with the device 960.

Such an association between the information of the types of the devices included in the first model and in the second model and the association information may be registered in advance in the storage unit 140 by using a table and the like. The storage unit 140 may store these associations as a first table and a second table, for example. The model converting unit 152 associates each device with the association information based on such registered information, and also models the connections between the respective devices as pieces of graphic information as shown in FIG. 8 and FIG. 9.

Then, the matching processing unit 154 performs the matching processing based on the association information. For example, the matching processing unit 154 determines that the device 860 and the device 960 are the corresponding devices based on the pieces of association information that are the "valve object" and the "ball valve" respectively included in the device 860 and the device 960. Because the matching processing unit 154 utilizes such association information based on the ontology, the matching processing unit 154 can match the devices even if the devices have different names from each other.

Also, the matching processing unit 154 may also perform the matching processing based on the association information about the connection. For example, the device 850 with which the association information being the "pump" is associated is connected to the device 860. According to this, the matching processing unit 154 may determine that a connection destination of the device 960 corresponding to the device 860 may be a device with which the association information being the "pump" is associated. Also, a device 952 and a device 954 that are associated with the association information being the "pump" are connected in parallel, and according to this, the matching processing unit 154 may determine that the device 850, and the device 952 and the device 954 are the corresponding devices.

In this way, the apparatus 100 according to the present embodiment can also determine a device-to-device correspondence relation between the devices having different names and different connections from each other by using a technology, such as the ontology, in the computer science, the information science and the like. That is, the apparatus 100 can accurately perform the matching processing by using a technology that is established systematically. Also, along with a development of such a technology, the accuracy and the efficiency of the apparatus 100 can also be improved.

Although the above has described that the apparatus 100 according to the present embodiment shows the matching result by the matching processing unit 154 to the user, and the user inputs an evaluation relative to the matching result and an indication and the like for a further matching, the apparatus 100 is not limited to this. For example, the matching processing unit 154 outputs, via the interface unit 130, matching candidates of the devices included in the static model 22 and the devices included in the piping and instrumentation diagram data 32. In response to an approval of the matching candidates, the matching processing unit 154 may match the devices to each other that have been set as the matching candidates.

Accordingly, the apparatus 100 can preferentially match the devices that are designated by the user. Also, because the apparatus 100 can perform the matching based on an order of priority made by the user, generation of the dynamic model 42 that is to be simulated can be efficiently generated.

Also, the matching processing unit 154 may also first perform the matching processing and then show the matching candidates to the user. In this case, the matching processing unit 154 may show, to the user, a number, a percentage and the like of the devices that can be matched according to the matching result of the matching candidates. Also, the matching processing unit 154 may respectively perform the matching processing on a plurality of matching candidates and show, to the user along with the plurality of matching candidates, the number, the percentage and the like of the devices that can be matched corresponding to each of the candidates.

Also, the matching processing unit 154 may also determine a priority of the matching candidates from the number, the percentage and the like of the devices that can be matched to set a display order of the matching candidates, display highlighting and the like. Also, the matching processing unit 154 may also output only the matching candidates having a priority that is equal to or greater than a reference. Also, the matching processing unit 154 may also show a progress of the matching processing to the user. In this case, the matching processing unit 154 may also further include a progress information output unit to output progress information indicating the progress of the matching of each device in the static model 22 and each device in the piping and instrumentation diagram data 32.

Although the above has described that the apparatus 100 according to the present embodiment generates and outputs the dynamic model 42 and also outputs the dynamic simulation result 44 by the dynamic simulator 40, the apparatus 100 is not limited to this. The apparatus 100 may also output the matching result from the matching unit 150. Also, the apparatus 100 may also accumulate the matching result by the matching unit 150 in the storage unit 140 or an external database and the like.

Accordingly, because the apparatus 100 can accumulate an appropriate matching result, the apparatus 100 can utilize the matching result for a next plant design, improvement and modification. For example, the apparatus 100 can grasp changed portions and the like by comparing the static model having been used for the previous design with the static model used for the present design. Accordingly, the apparatus 100 can perform, by utilizing the previous matching result, the matching processing on the changed portions only for the devices that are not changed in the present design.

Also, the devices, among the matching result of the respective devices, that are input by the user as the devices to be matched may be stored in the database. Also, in the next matching and thereafter, if a corresponding combination exists in the first model and the second model, the matching processing unit 154 may add the combination as the matching result. Accordingly, an appropriate matching that cannot be automatically picked up by certain algorithm can be added to the matching result without the indication of the user.

Also, among the matching result of the respective devices, the devices that are inappropriately matched by the user may be stored in the database. Then, if a combination corresponding to the next matching result and thereafter exists in the matching result, the matching processing unit 154 may also remove the combination from the matching result. Accordingly, the inappropriately matching result that is automatically picked up by certain algorithm can be removed without the indication of the user.

As described above, the apparatus 100 can improve the working efficiency of generation of the dynamic model 42 by outputting the matching result only. Note that if the matching accuracy is improved by accumulating the matching result and the like, the apparatus 100 may also omit the operation of the user input shown as S360 in FIG. 3. As described above, the apparatus 100 can reduce labor of manual input of the user during the process of generating the dynamic model 42, can also reduce occurrence frequency of operation mistakes, and can improve the efficiency of the plant design and creation of the operation training system.

Also, various embodiments of the present invention may be described with reference to flow charts and block diagrams. Here, the block diagrams may represent: (1) steps of processes of performing operations or (2) sections of an apparatus serving to perform operations. Specific steps and sections may be implanted by at least one of a dedicated circuit, a programmable circuit supplied along with a computer-readable instruction stored on a computer-readable medium, and a processor supplied along with a computer-readable instruction stored on a computer-readable medium. The dedicated circuit may include at least one of a digital hardware circuit and an analog hardware circuit, and may include at least one of an integrated circuit (IC) and a discrete circuit. The programmable circuit may include a reconfigurable hardware circuit that includes a memory element and the like such as a logical AND, logical OR, logical XOR, logical NAND, logical NOR and another logical operation, a flip-flop, a register, a field programmable gate array (FPGA) and a programmable logic array (PLA).

The computer-readable medium may include any tangible device that can store an instruction executed by an appropriate device. As a result, the computer-readable medium having the instruction stored thereon includes a product including an instruction that can be executed to make a means for performing an operation specified in flow charts or block diagrams. As an example of the computer-readable medium, an electronic storage medium, a magnetic storage medium, an optical storage medium, an electromagnetic storage medium, a semiconductor storage medium and the like may be included. As a more specific example of the computer-readable medium, a floppy (registered trademark) disk, a diskette, a hard disk, a random access memory (RAM), a read-only memory (ROM), an erasable programmable read-only memory (EPROM or flash memory), electrically erasable programmable read-only memory (EEPROM), a static random access memory (SRAM), a compact discrete read-only memory (CD-ROM), a digital versatile disk (DVD), a Blu-Ray(registered trademark) (RTM) disk, a memory stick, an integrated circuit card and the like may be included.

The computer-readable instruction may include any of an assembler instruction, an instruction set architecture (ISA) instruction, a machine instruction, a machine-dependent instruction, a microcode, a firmware instruction, state setting data, or a code or an object code described by an arbitrary combination of one or more programming languages including an object oriented programming language such as Smalltalk, JAVA (registered trademark) and C++, and a conventional procedural programming language such as "C" programming language or a similar programming language.

The computer-readable instruction may be provided, for a processor or a programmable circuit of a general purpose computer, a specific purpose computer or another programmable data processing apparatus, locally or via a local area network (LAN) and a wide area network (WAN) such as Internet. To make a means for performing an operation specified in a flow chart or a block diagram, the computer-readable instruction may be performed. As an example of the processor, a computer processor, a processing unit, a microprocessor, a digital signal processor, a controller, a microcontroller and the like are included.

Figure 10:
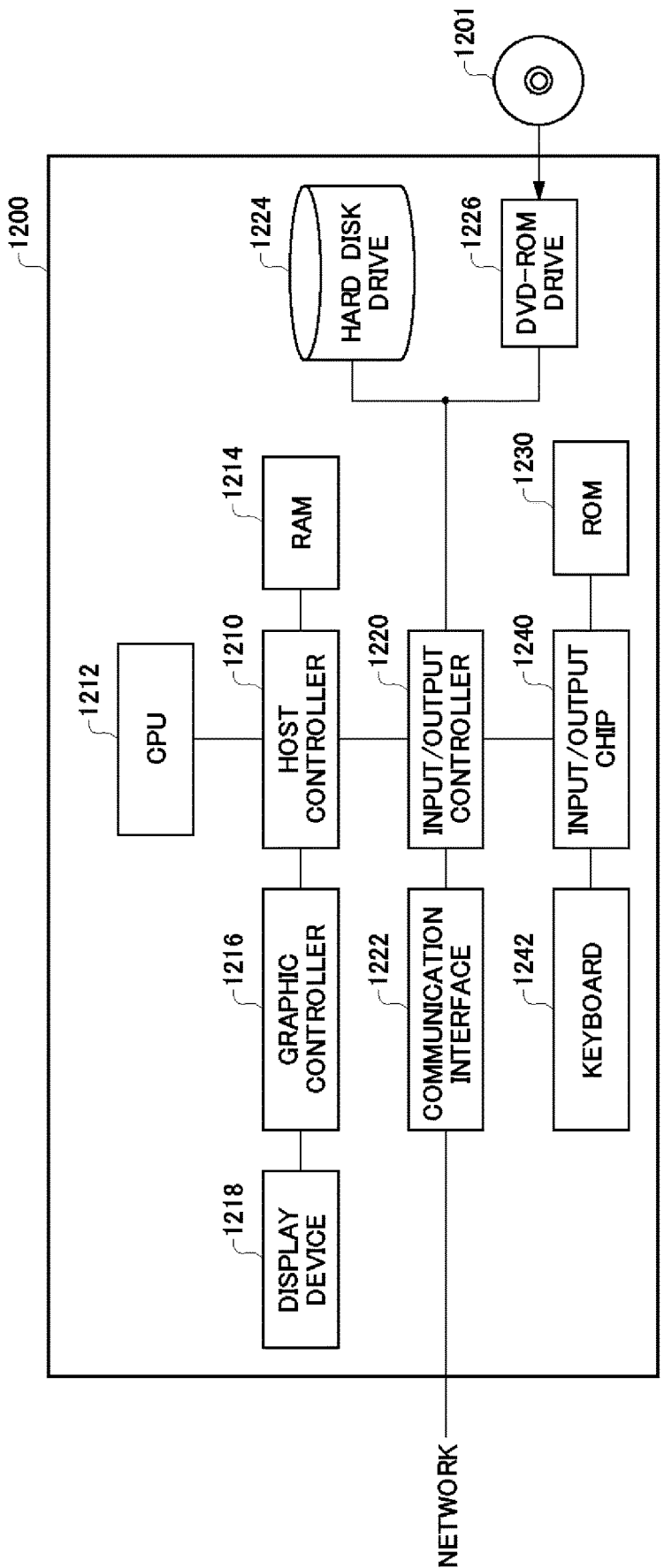
FIG. 10 shows a configuration example of a computer 1200 in which a plurality of aspects of the present invention may entirely or partially embodied.

FIG. 10 shows a configuration example of a computer 1200 in which the plurality of aspects of the present invention may be entirely or partially embodied. A program installed in the computer 1200 can make the computer 1200 serve as an operation associated with an apparatus according to an embodiment of the present invention or one or more "units" of the apparatus or execute the operation or the one or more "units", and/or can make the computer 1200 execute a process according to an embodiment of the present invention or steps of the process. Such a program may be executed by a CPU 1212 to make the computer 1200 perform a specific operation associated with some or all of blocks of the flowcharts and the block diagrams described in the present specification. Also, a process according to an embodiment of the present invention or steps of the process may also be performed in a cloud environment.

The computer 1200 according to the present embodiment includes the CPU 1212, an RAM 1214, a graphic controller 1216 and a display device 1218, which are mutually connected via a host controller 1210. The computer 1200 also includes a communication interface 1222, a hard disk drive 1224, a DVD-ROM drive 1226 and an input/output unit such as an IC card drive, which are connected to the host controller 1210 via an input/output controller 1220. The computer also includes legacy input/output units such as an ROM 1230 and a keyboard 1242, which are connected to the input/output controller 1220 via the input/output chip 1240.

The CPU 1212 operates according to a program stored in the ROM 1230 and the RAM 1214 to control each unit accordingly. The graphic controller 1216 acquires image data, that is generated by the CPU 1212, in a frame buffer and the like provided in the RAM 1214, or in the graphic controller 1216 itself, and display the image data on the display device 1218.

The communication interface 1222 communicates with another electronic device via a network. The hard disk drive 1224 stores a program and data used by the CPU 1212 in the computer 1200. The DVD-ROM drive 1226 reads the program or the data from the DVD-ROM 1201 and provides the program or the data to the hard disk drive 1224 via the RAM 1214. The IC card drive reads the program and the data from an IC card and/or writes the program and the data in the IC card.

The ROM 1230 stores thereon a boot program and the like executed by the computer 1200 at the time of an activation, and/or a program depending on hardware of the computer 1200. The input/output chip 1240 may also connect various input/output units to the input/output controller 1220 via a parallel port, a serial port, a keyboard port, a mouse port and the like.

The programs are provided by a computer-readable storage medium such as the DVD-ROM 1201 or an IC card. The programs are read from the computer-readable storage medium, and are installed in the hard disk drive 1224, the RAM 1214 or the ROM 1230, that are also examples of the computer-readable storage medium, and executed by the CPU 1212. Information processing described in these programs is read by the computer 1200 and results in cooperation between the programs and pieces of hardware of various types described above. The apparatus or method may be configured by realizing an operation or processing of the information through the use of the computer 1200.

For example, if communication is performed between the computer 1200 and an external device, the CPU 1212 may execute a communication program loaded on the RAM 1214 and instruct the communication interface 1222 for a communication processing based on the processing described in the communication program. The communication interface 1222 reads transmission data stored in a transmission buffer region provided in a recording medium such as the RAM 1214, the hard disk drive 1224, the DVD-ROM 1201 or the IC card under a control of the CPU 1212 and transmits the read transmission data to a network or writes reception data received from the network in a reception buffer region and the like provided on the recording medium.

Also, the CPU 1212 may perform various types of processing on the data on the RAM 1214 so that all or necessary parts of files or database stored in an external recording medium such as the hard disk drive 1224, the DVD-ROM drive 1226 (DVD-ROM 1201), the IC card and the like are read by the RAM 1214. Next, the CPU 1212 may write back the processed data in the external recording medium.

Various types of information such as various types of programs, data, tables and database may be stored in a recording medium to be information-processed. The CPU 1212 may execute, on the read data from the RAM 1214, various types of processing including various types of operations, information processing, condition determination, conditional branch, unconditional branch, information search/replacement and the like that are described throughout the present disclosure and are designated by an instruction sequence of a program, and write back the result to the RAM 1214. Also, the CPU 1212 may search for the files in the recording medium and the information in the database and the like. For example, if a plurality of entries each having an attribute value of a first attribute associated with an attribute value of a second attribute are stored in a recording medium, the CPU 1212 may search, from the plurality of entries, for an entry in which the attribute value of the first attribute matches a designated condition, and read an attribute value of a second attribute stored in the entry, and accordingly acquire the attribute value of the second attribute associated with the first attribute that satisfies a predetermined condition.

The programs or software module according to the above description may be stored in a computer-readable storage medium on the computer 1200 or near the computer 1200. Also, a recording medium such as a hard disk or an RAM provided in a server system connected to a dedicated communication network or Internet is usable as a computer-readable storage medium so as to provide the programs to the computer 1200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

REFERENCE SIGNS LIST

10 . . . generating apparatus; 20 . . . static simulator; 22 . . . static model; 30 . . . plant engineering software; 32 . . . piping and instrumentation diagram data; 40 . . . dynamic simulator; 42 . . . dynamic model; 44 . . . dynamic simulation result; 100 . . . apparatus; 110 . . . static model acquiring unit; 120 . . . piping and instrumentation diagram data acquiring unit; 130 . . . interface unit; 140 . . . storage unit; 150 . . . matching unit; 152 . . . model converting unit; 154 . . . matching processing unit; 160 . . . dynamic model generating unit; 162 . . . integrated model generating unit; 164 . . . converting unit; 602 . . . input unit; 604 . . . output unit; 610 . . . heat exchanger; 620 . . . reactor; 630 . . . tank; 640 . . . compressor; 650 . . . pump; 660 . . . valve; 702 . . . input unit; 704 . . . output unit; 706 . . . valve; 708 . . . valve; 712 . . . first heat exchanger; 714 . . . second heat exchanger; 720 . . . reactor; 730 . . . tank; 740 . . . compressor; 752 . . . first pump; 754 . . . second pump; 760 . . . valve; 802 . . . input unit; 804 . . . output unit; 810 . . . device; 820 . . . device; 830 . . . device; 840 . . . device; 850 . . . device; 860 . . . device; 902 . . . input unit; 904 . . . output unit; 952 . . . device; 954 . . . device; 960 . . . device; 1200 . . . computer; 1201 . . . DVD-ROM; 1210 . . . host controller; 1212 . . . CPU; 1214 . . . RAM; 1216 . . . graphic controller; 1218 . . . display device; 1220 . . . input/output controller; 1222 . . . communication interface; 1224 . . . hard disk drive; 1226 . . . DVD-ROM drive; 1230 . . . ROM; 1240 . . . input/output chip; 1242 . . . keyboard

What is claimed is:

1. An apparatus comprising:
a static model acquiring unit configured to acquire a static model indicating a steady state of a plant;
a piping and instrumentation diagram data acquiring unit configured to acquire piping and instrumentation diagram data of the plant;
a matching unit configured to match a device included in the static model and a device included in the piping and instrumentation diagram data to each other to identify a device-to-device correspondence relation;
a dynamic model generating unit configured to generate a dynamic model that is a model calculating a dynamic state of the plant based on a matching result by the matching unit; and
a dynamic simulator configured to perform a dynamic simulation by using the dynamic model, wherein
the plant is at least a part of at least one of a production plant, a manufacturing plant, a chemical plant, a sludge treatment plant, a wastewater treatment plant, an air conditioning system, and a thermodynamic system,
the matching unit includes:
a model converting unit configured to convert the static model into a first model based on the static model and convert the piping and instrumentation diagram data into a second model based on the piping and instrumentation diagram data, the first and second models having a common representation format; and
a matching processing unit configured to match a device included in the first model and a device included in the second model to each other, and
the dynamic model generating unit includes:
an integrated model generating unit configured to generate an integrated model by integrating the first model and the second model; and
a converting unit configured to convert the integrated model into the dynamic model,
the matching unit is configured to identify a device-to-device correspondence relation based on a result of comparing device information added to devices included in the static model with device information added to devices included in the piping and instrumentation diagram data or a result of comparing a connection relation between devices in the static model with a connection relation between devices in the piping and instrumentation diagram data.

2. The apparatus according to claim 1, wherein
the dynamic model generating unit is configured to generate the dynamic model by using a connection relation between a plurality of devices in the piping and instrumentation diagram data and using parameters of devices that are in the static model and respectively correspond to the plurality of devices.

3. The apparatus according to claim 1, wherein
the matching unit is configured to identify a device-to-device correspondence relation based on a result of comparing device information added to devices included in the static model with device information added to devices included in the piping and instrumentation diagram data.

4. The apparatus according to claim 1, wherein
the matching unit is configured to identify a device-to-device correspondence relation based on a result of comparing a connection relation between devices in the static model with a connection relation between devices in the piping and instrumentation diagram data.

5. The apparatus according to claim 4, wherein
in response to receiving a designation that a first device in the static model and a second device in the piping and instrumentation diagram data are corresponding devices, the matching unit is configured to identify a device-to-device correspondence relation based on a result of comparing a connection relation between the first device and each device in the static model with a connection relation between the second device and each device in the piping and instrumentation diagram data.

6. The apparatus according to claim 5, wherein
if there are devices that cannot be matched with another left, the matching unit is further configured to receive a designation of a device-to-device correspondence relation between a device in the static model and a device in the piping and instrumentation diagram data.

7. The apparatus according to claim 5, wherein
the matching unit is configured to:
output information of devices that are set as matching candidates, including a device included in the static model and a device included in the piping and instrumentation diagram data; and
match the devices that are set as the matching candidates to each other in response to an approval of the matching candidates.

8. The apparatus according to claim 4, wherein
the matching unit is configured to:
generate a first model that is a semantic model indicating each device and a connection relation between devices in the static model by using ontology of the static model;
generate a second model that is a semantic model indicating each device and a connection relation between devices in the piping and instrumentation diagram data by using ontology of the piping and instrumentation diagram data; and
identify a device-to-device correspondence relation by using the first model and the second model.

9. The apparatus according to claim 1, further comprising
a progress information output unit configured to output progress information indicating a progress of matching each device in the static model with each device in the piping and instrumentation diagram data.

10. A method comprising:
acquiring a static model indicating a steady state of a plant;
acquiring piping and instrumentation diagram data of the plant; and
converting the static model into a first model based on the static model and converting the piping and instrumentation diagram data into a second model based on the piping and instrumentation diagram data, the first and second models having a common representation format;
matching a device included in the first model and a device included in the second model to each other, including identifying a device-to-device correspondence relation based on a result of comparing device information added to devices included in the static model with device information added to devices included in the piping and instrumentation diagram data or a result of comparing a connection relation between devices in the static model with a connection relation between devices in the piping and instrumentation diagram data;
generating an integrated model by integrating the first model and the second model;

converting the integrated model into a dynamic model that is a model calculating a dynamic state of the plant; and simulating using a dynamic simulation by using the dynamic model, wherein the plant is at least a part of at least one of a production plant, a manufacturing plant, a chemical plant, a sludge treatment plant, a wastewater treatment plant, an air conditioning system, and a thermodynamic system.

11. A non-transitory computer readable medium having stored thereon a program which, when executed by a computer, causes a computer to perform operations comprising:

acquiring a static model indicating a steady state of a plant;

acquiring piping and instrumentation diagram data of the plant; and converting the static model into a first model based on the static model and converting the piping and instrumentation diagram data into a second model based on the piping and instrumentation diagram data, the first and second models having a common representation format;

matching a device included in the first model and a device included in the second model to each other, including identifying a device-to-device correspondence relation based on a result of comparing device information added to devices included in the static model with device information added to devices included in the piping and instrumentation diagram data or a result of comparing a connection relation between devices in the static model with a connection relation between devices in the piping and instrumentation diagram data;

generating an integrated model by integrating the first model and the second model;

converting the integrated model into a dynamic model that is a model calculating a dynamic state of the plant; and simulating using a dynamic simulation by using the dynamic model, wherein the plant is at least a part of at least one of a production plant, a manufacturing plant, a chemical plant, a sludge treatment plant, a wastewater treatment plant, an air conditioning system, and a thermodynamic system.

\* \* \* \* \*